(12) United States Patent
Singh et al.

(10) Patent No.: US 9,142,451 B2
(45) Date of Patent: Sep. 22, 2015

(54) REDUCED CAPACITANCE INTERLAYER STRUCTURES AND FABRICATION METHODS

(71) Applicant: GLOBALFOUNDRIES Inc., Grand Cayman (KY)

(72) Inventors: Sunil Kumar Singh, Mechanicville, NY (US); Matthew Herrick, Cedar Park, TX (US); Teck Jung Tang, Ballston Lake, NY (US); Dewei Xu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 43 days.

(21) Appl. No.: 14/027,479

(22) Filed: Sep. 16, 2013

(65) Prior Publication Data

US 2015/0076705 A1 Mar. 19, 2015

(51) Int. Cl.
*H01L 21/768* (2006.01)
*H01L 23/48* (2006.01)

(52) U.S. Cl.
CPC ...... *H01L 21/76835* (2013.01); *H01L 21/7682* (2013.01); *H01L 21/76807* (2013.01); *H01L 21/76877* (2013.01); *H01L 23/481* (2013.01)

(58) Field of Classification Search
None
See application file for complete search history.

(56) References Cited

U.S. PATENT DOCUMENTS

| | | | |
|---|---|---|---|
| 7,682,963 | B2 | 3/2010 | Chen et al. |
| 2005/0258542 | A1* | 11/2005 | Fuller et al. ................... 257/759 |
| 2008/0171431 | A1* | 7/2008 | Yu et al. ......................... 438/618 |
| 2010/0032841 | A1* | 2/2010 | Naujok et al. ................. 257/758 |
| 2010/0102452 | A1* | 4/2010 | Nakao ............................ 257/773 |
| 2013/0341793 | A1* | 12/2013 | Suzumura et al. ............ 257/751 |

* cited by examiner

*Primary Examiner* — Daniel Luke
(74) *Attorney, Agent, or Firm* — Naresh K. Kannan, Esq.; Heslin Rithnberg Farley & Mesiti P.C.

(57) ABSTRACT

Interlayer fabrication methods and interlayer structure are provided having reduced dielectric constants. The methods include, for example: providing a first uncured insulating layer with an evaporable material; and disposing a second uncured insulating layer having porogens above the first uncured insulating layer. The interlayer structure includes both the first and second insulating layers, and the methods further include curing the interlayer structure, leaving air gaps in the first insulating layer, and pores in the second insulating layer, where the air gaps are larger than the pores, and where the air gaps and pores reduce the dielectric constant of the interlayer structure.

12 Claims, 7 Drawing Sheets

REDUCED CAPACITANCE INTERLAYER STRUCTURES AND FABRICATION METHODS

FIELD OF THE INVENTION

The present invention relates to structures and methods for facilitating fabricating integrated circuits, and more particularly, to structures and methods for reducing capacitance between interconnect layers of an integrated circuit.

BACKGROUND OF THE INVENTION

As the density of semiconductor integrated circuits increases, and the corresponding size of circuit elements decreases, circuit performance may be dominated by resistive-capacitive (RC) delay, for instance, between interconnect layers. RC delay may be reduced by decreasing the overall capacitance of an integrated circuit, and its components. In particular, RC delay may advantageously be reduced by customizing interlayer dielectrics used between, for instance, adjacent metal layers of the overlying interconnect structure.

Accordingly, a need exists for reduced capacitance interlayer structures and fabrication methods.

BRIEF SUMMARY

The shortcomings of the prior art are overcome, and additional advantages are provided through the provision, in one aspect, of a method of fabricating an interlayer structure with a reduced dielectric constant. The fabricating includes: providing a first uncured layer, the first uncured layer being a first insulating layer, and including an evaporable material; disposing a second uncured layer above the first uncured layer, the second uncured layer being a second insulating layer, and including porogens, wherein the interlayer structure includes the first insulating layer and the second insulating layer; and curing the interlayer structure, the curing evaporating at least a portion of the evaporable material of the first insulating layer leaving air gaps therein, and degrading at least a portion of the porogens of the second insulating layer leaving pores therein, wherein the air gaps are larger than the pores, and the curing reduces the dielectric constant of the interlayer structure.

In a further aspect, a structure is provided which includes: an interlayer structure, the interlayer structure including: a first insulating layer, the first insulating layer including air gaps; a second insulating layer disposed over the first insulating layer, the second insulating layer including pores, wherein the air gaps are larger than the pores; and a conductive structure through the second insulating layer of the interlayer structure and at least partially into the first insulating layer of the interlayer structure, wherein the second insulating layer including the pores facilitates maintaining structural stability of the conductive structure within the interlayer structure, notwithstanding the presence of the larger air gaps within the first insulating layer of the interlayer structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
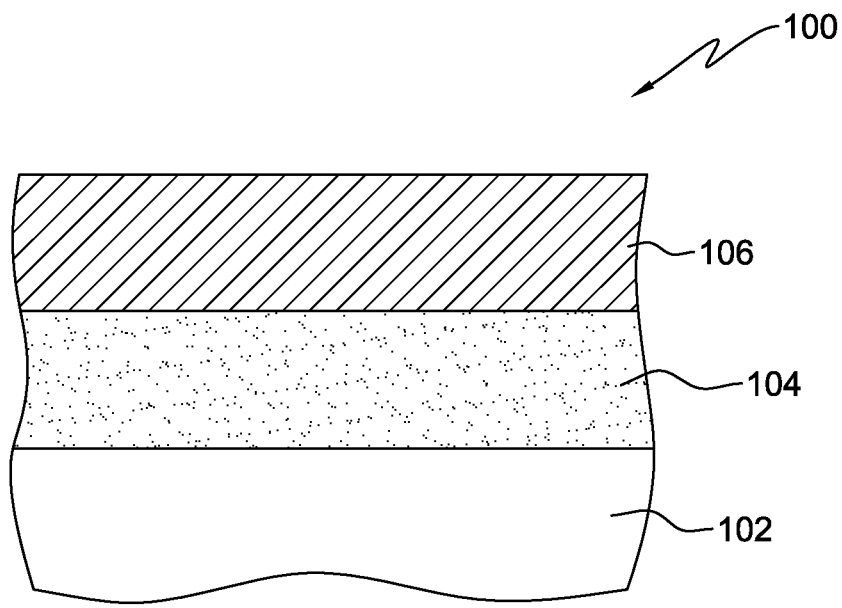
FIG. 1A depicts a partial cross-sectional elevation view of one embodiment of a structure, which includes a metal layer, and is obtained during a fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

The present disclosure provides, in part, cured interlayer structures with reduced dielectric constants and fabrication methods thereof, which advantageously increase circuit performance by decreasing resistive-capacitance (RC) delay. Using insulating layers having air gaps or pores as interlayer structures prior to forming conductive structures could lead to circuit damage and instability. Therefore, the present disclosure overcomes these limitations by providing uncured interlayer structures, which provide structural stability of the conductive structures during back-end of line processing, followed by curing the interlayer structures, which reduces the dielectric constant of the interlayer structures by forming air gaps and pores within the structures.

Generally stated, provided herein, in one aspect, is a method for facilitating fabricating an interlayer structure with a reduced dielectric constant. The facilitating fabricating includes: providing a first uncured layer, the first uncured layer being a first insulating layer, and including an evaporable material; disposing a second uncured layer above the first uncured layer, the second uncured layer being a second insulating layer, and including porogens, wherein the interlayer structure includes the first insulating layer and the second insulating layer; and curing the interlayer structure, the curing evaporating at least a portion of the evaporable material of the first insulating layer, leaving air gaps therein, and degrading at least a portion of the porogens of the second insulating layer, leaving pores therein, wherein the air gaps are larger than the pores, and the curing reduces the dielectric constant of the interlayer structure. In an enhanced embodiment, the fabricating may further include, prior to the curing, providing a third uncured layer disposed below the first uncured layer, wherein the first uncured layer is disposed between the third uncured layer and the second uncured layer, the third uncured layer being a third insulating layer, and including porogens, and wherein the interlayer structure further includes the third insulating layer, and the curing further includes degrading at least a portion of the porogens of the third insulating layer leaving pores therein. In one example, after curing the interlayer structure, the interlayer structure has an effective dielectric constant between 1.8 and 2.0. In another example, the first uncured layer includes a first $C_xH_y$ material, and the second uncured layer includes a second $C_xH_y$ material. In a further example, the porogens include one of a terpinene or a cyclodextrin material, and the evaporable material may include a $C_xH_y$ material. By way of specific example, the first insulating layer (and third insulating layer) may have a thickness of between 30 and 60 nanometers, and the second insulating layer may also have a thickness in the range of 30 and 60 nanometers.

In a further embodiment, the method may include, prior to curing the interlayer structure: forming at least one opening in the interlayer structure, the opening extending through the second uncured layer and at least partially into or through the first uncured layer (or if a third uncured layer is present, through the first uncured layer, and at least partially into or through the third uncured layer); and providing a conductive material within the at least one opening to form a conductive structure, wherein providing the conductive material prior to curing the interlayer structure inhibits migration of the conductive material into the first insulating layer, the second insulating layer (and, if present, the third insulating layer). In such a case, after curing the interlayer structure, the second insulating layer has pores (and, if present, the third insulating layer includes pores), which assist in lowering RC delay and facilitate in maintaining structural stability of the conductive structure within the interlayer structure, notwithstanding the presence of the larger air gaps in the first insulating layer.

In another example, the fabricating further includes, prior to the curing, providing a substrate structure below the interlayer structure, wherein the substrate structure includes a metal layer disposed above a substrate of the substrate structure, and wherein the conductive structure extends to the metal layer. In such a case, the method could include, after curing the interlayer structure, disposing another metal layer over the interlayer structure, the conductive structure being fabricated to facilitate electrical connection between the metal layer and the another metal layer. Furthermore, the substrate structure could further include a device layer, with the device layer being disposed, for instance, between the metal layer and the substrate of the substrate structure, and wherein the conductive structure facilitates electrical connection between the device layer and the another metal layer.

In another aspect, a structure is provided which includes: an interlayer structure, the interlayer structure including: a first insulating layer, the first insulating layer including air gaps; a second insulating layer disposed above the first insulating layer, the second insulating layer including pores, where the air gaps are larger than the pores; and one or more conductive structures extending into the second insulating layer of the interlayer structure and at least partially into or through the first insulating layer of the interlayer structure, wherein the second insulating layer having the smaller pores facilitates maintaining structural stability of the conductive structure within the interlayer structure, notwithstanding the presence of the larger air gaps within the first insulating layer of the interlayer structure. In an enhanced aspect, the interlayer structure could further include a third insulating layer disposed below the first insulating layer, the third insulating layer including pores. In this embodiment, the first insulating layer is disposed between the third insulating layer and the second insulating layer, and the third insulating layer having the pores further facilitates maintaining structural stability of the conductive structure within the interlayer structure, notwithstanding the presence of the air gaps within the first insulating layer of the interlayer structure.

In another embodiment, the structure further includes: a metal layer disposed below the interlayer structure; and another metal layer disposed above the interlayer structure, where the conductive structure(s) extends from the metal layer to the another metal layer, and facilitates electrical connection between the metal layer and the another metal layer.

Reference is made below to the drawings, which are not drawn to scale for ease of understanding, wherein the same reference numbers used throughout different figures designate the same or similar components.

FIG. 1A illustrates a partial cross-sectional elevation view of a structure 100 obtained during fabrication of one or more interlayer structures, in accordance with one or more aspects of the present invention. In the example shown, structure 100 includes a substrate 102, which may be (in one example) a bulk semiconductor material such as a bulk silicon wafer. As another example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like, and may be n-type or p-type doped. Substrate 102 might be, for instance, approximately 600-700 micrometers thick, as one example only.

During front-end of line (FEOL) processing, individual devices are created, for instance, in a device layer 104, including, for example, metal-oxide-semiconductor field-effect transistors (MOSFETs) such as FinFETs, as well as capacitors, resistors, and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or at least partially connected) semiconductor devices may be fabricated in device layer 104.

After FEOL processing, as well as middle-of-the-line (MOL) processing, BEOL processing is performed, including, for example, silicidation of source and drain regions, deposition of a pre-metal dielectric (PMD) layer, and formation of vias or trenches in the PMD layer. During BEOL processing, a layer of a conductive material such as metal layer 106 (e.g., metal 1 layer), may be deposited and patterned into a network of interconnecting lines or wiring, for instance, to facilitate the desired interconnection of semiconductor devices in device layer 104 as required to implement an integrated circuit design. The deposition of metal layer 106, followed by subsequent processing to pattern, etch, and fill trenches and vias with conductive structures, may be repeated during BEOL processing such that several metal layers, for example, between six and ten metal layers, are deposited and processed in a similar manner. Between each metal layer, interlayer structures may be formed to isolate signals from the various metal layers and to support structural integrity of the integrated circuit structure, including the metal layers and the interconnecting conductive structures such as trenches or vias. As an example, the interlayer structures may comprise one or more interlayer dielectrics.

Figure 1B:
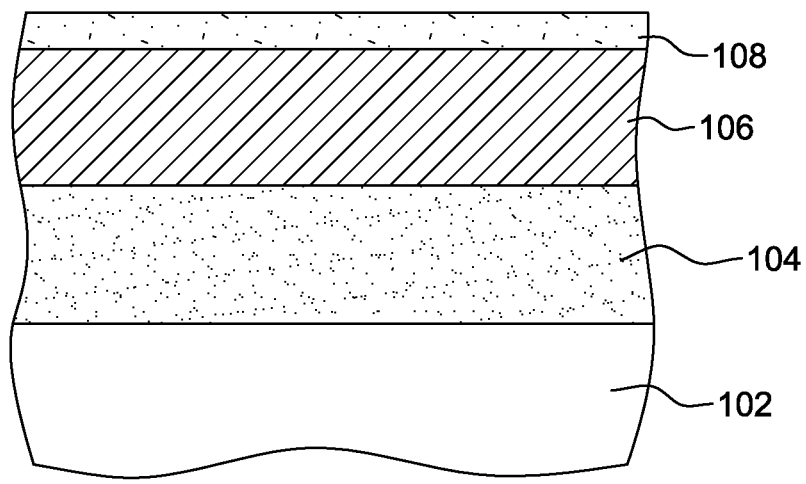
FIG. 1B depicts the structure of FIG. 1A after providing an etch-stop layer over the structure, in accordance with one or more aspects of the present invention.

FIG. 1B illustrates structure 100 of FIG. 1A after providing an etch-stop layer 108 over metal layer 106 to facilitate (in one embodiment) a subsequent etching step. Etch-stop layer 108 may have a minimum thickness such that subsequent processing including an etching process for formation of openings in layers above the etch stop, will properly stop on or at etch-stop layer 108 with enough margin for error. Etch-stop layer 108 may include a nitride or an oxide, such as, for example, silicon nitride or silicon oxide, an oxynitride, a combination thereof, or any other suitable material, which may be chosen to be compatible with the etch chemistry and technique to be employed.

Figure 1C:
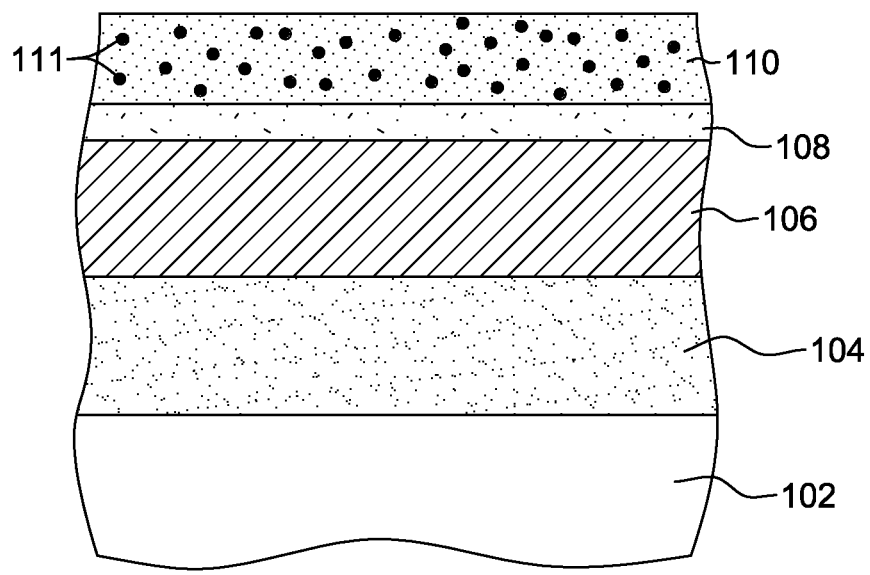
FIG. 1C depicts the structure of FIG. 1B after disposing an uncured insulating layer including porogens over the structure, in accordance with one or more aspects of the present invention.

FIG. 1C illustrates the structure of FIG. 1B after disposing an insulating layer 110 over the structure. Insulating layer 110 may be, in one embodiment, an uncured layer having porogens 111. Porogens 111 are particles that may be degraded, or removed, leaving pores, using, for example, a thermal, ultraviolet (UV), or other curing process such as discussed below with reference to FIG. 1J. Porogens 111, which may be nanopores, may be roughly spherical in shape, or may have irregular shapes and sizes, and may or may not be uniformly dispersed within insulating layer 110. In another embodiment, insulating layer 110 may include, for example, a matrix-porogen system, wherein porogens, are dispersed in a matrix material. In one example, some porogens 111 may be in direct contact with one another, while in another example, porogens 111 may be uniformly distributed. Insulating layer 110 may be deposited from a gaseous phase using CVD, such as, for example, plasma-enhanced CVD (PECVD), or from a liquid phase using a spin-on deposition process, and by way of example, may have a thickness in the range of 30-60 nanometers. Further, porogens 111 may have a diameter or critical dimension of approximately 1 to 3 nanometers. Porogens 111 may be, for example, a terpinene material, such as a-terpinene (ATRP), or may be a cyclodextrin material, such as b-cyclodextrin (BCD). In another example, porogens 111 may be any commercially available gas or liquid pore-forming material, including Porogen A.

Figure 1D:
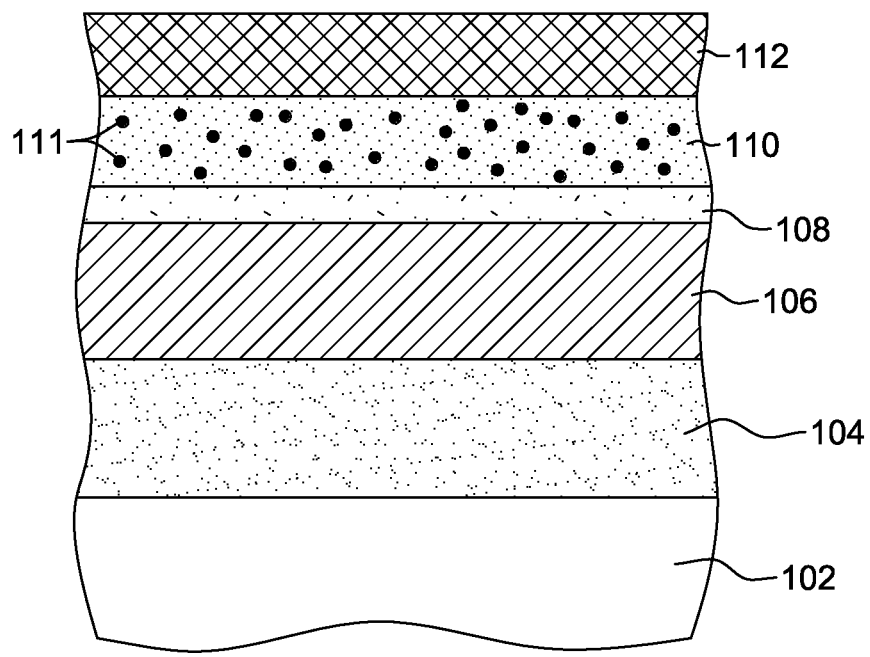
FIG. 1D depicts the structure of FIG. 1C after disposing an uncured insulating layer including evaporable material over the structure, in accordance with one or more aspects of the present invention.

FIG. 1D illustrates the structure of FIG. 1C after disposing insulating layer 112 over insulating layer 110. In one example, insulating layer 112 may be an uncured layer comprising an evaporable material, which is capable of being evaporated to create air gaps therein through a curing process using, for example, one or more of thermal, UV, X-ray, infrared, visual light, or electron-beam (e-beam) energy sources, etc. In one example, insulating layer 112 comprises a $C_xH_y$ compound, which may or may not contain silicon, and which may have a thickness in the range of 30-60 nanometers (by way of example only). In another embodiment, insulating layer 112 includes an organic compound. Further, insulating layer 112 may be a photonic decomposable material, a thermal decomposable material, or an e-beam decomposable material, and may be formed using any suitable process, such as, for example, CVD.

Figure 1E:
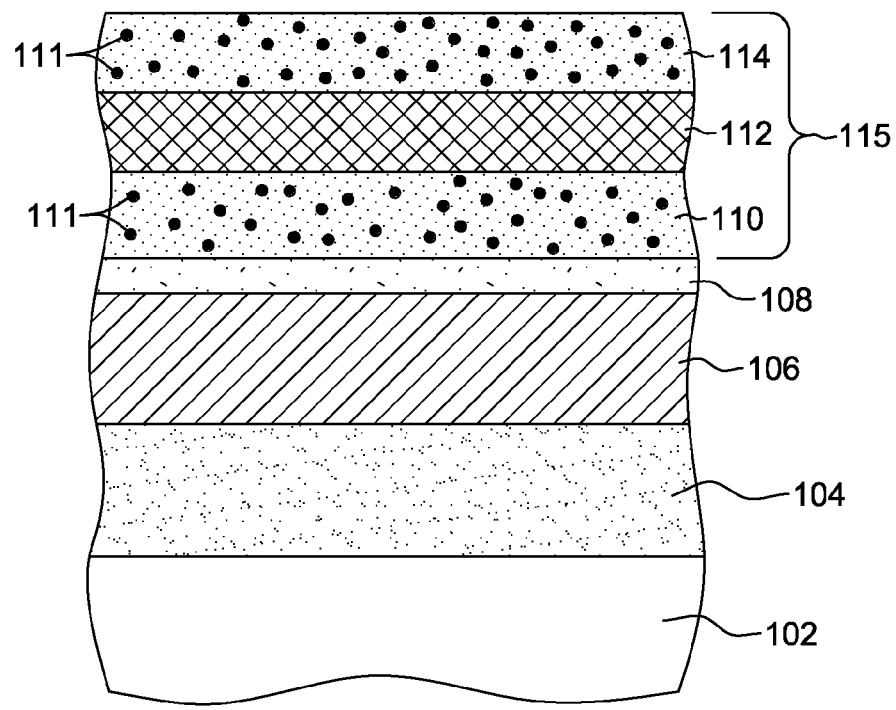
FIG. 1E depicts the structure of FIG. 1D after disposing another uncured insulating layer including porogens over the structure, in accordance with one or more aspects of the present invention.

FIG. 1E illustrates the structure of FIG. 1D after disposing insulating layer 114 over insulating layer 112. In one embodiment, insulating layer 114 may be an uncured layer comprising porogens 111, and may be deposited using any of the techniques noted above in connection with insulating layer 110, and may have (by way of example) a thickness between 30 and 60 nanometers. In addition, insulating layer 114 may have similar material properties as insulating layer 110, or the material composition of insulating layer 114 may differ from that of insulating layer 110. For example, the concentration and size of porogens 111 in the two layers may be different. After providing insulating layer 114, in one embodiment, an interlayer structure 115 is defined comprising, for example, insulating layer 110 (including porogens 111), insulating layer 112 (including an evaporable material), and insulating layer 114 (including porogens 111). Interlayer structure 115, in its uncured state, comprises a dense, substantially rigid, insulating material capable of supporting patterning, etching, and filling processing with minimal damage, as described below with respect to FIG. 1F through FIG. 1I. Such processing may subsequently be followed by curing to introduce air gaps and pores as described below with respect to FIG. 1J, in order to advantageously reduce capacitance of the interlayer structure.

Using porous materials during BEOL processing could possibly be problematic during chemical mechanical polishing (CMP). For example, CMP of ULK layers may be difficult because the ULK material is porous and soft, potentially leading to a less-than-ideal CMP height uniformity. In later steps to fill the trenches and vias with conductive structures, this could translate into metal interconnect height uniformity issues and increased interconnect property variability. The process described hereinbelow addresses or mitigates against these issues.

Figure 1F:
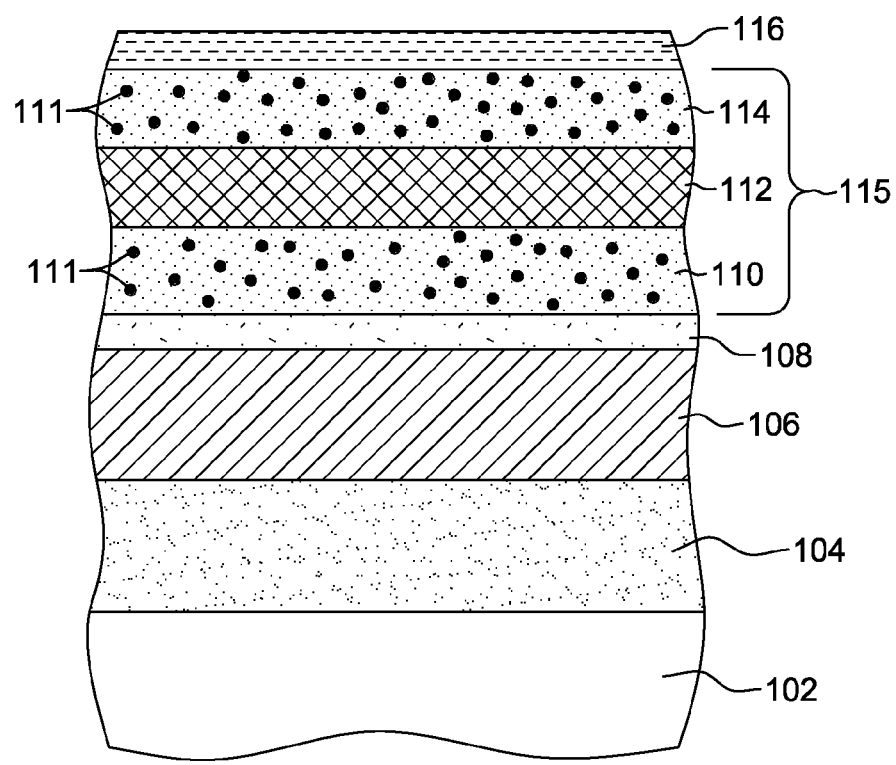
FIG. 1F depicts the structure of FIG. 1E after disposing a protective layer over the structure, in accordance with one or more aspects of the present invention.

FIG. 1F illustrates the structure of FIG. 1E after providing a protective layer 116 over insulating layer 114. Protective layer 116 may be used, in a subsequent processing step, to support patterning and forming openings in interlayer structure 115. In one embodiment, protective layer 116 may be a hard mask deposited over interlayer structure 115, and in one specific example, may include a nitride, such as, for example, silicon nitride. The deposition process may include any conventional process such as, for example, low temperature CVD, PECVD, or atomic layer deposition (ALD). In one specific example, silicon nitride may be deposited using process gases such as, for example, dichlorosilane ($SiH_2Cl_2$) and ammonia ($NH_3$), and known process conditions. In another example, where no high temperature processes are involved, optical dispersive layer (ODL) and flowable CVD (FCVD) masking may alternatively be used. In a further example, a low-pressure CVD or ALD-created mask may be used to form protective layer 116. In other examples, other hard mask materials, such as metals, may be used, or the protective layer 116 may be a hard mask having an oxide, oxynitride, or metal oxide material, deposited using any conventional process.

Figure 1G:
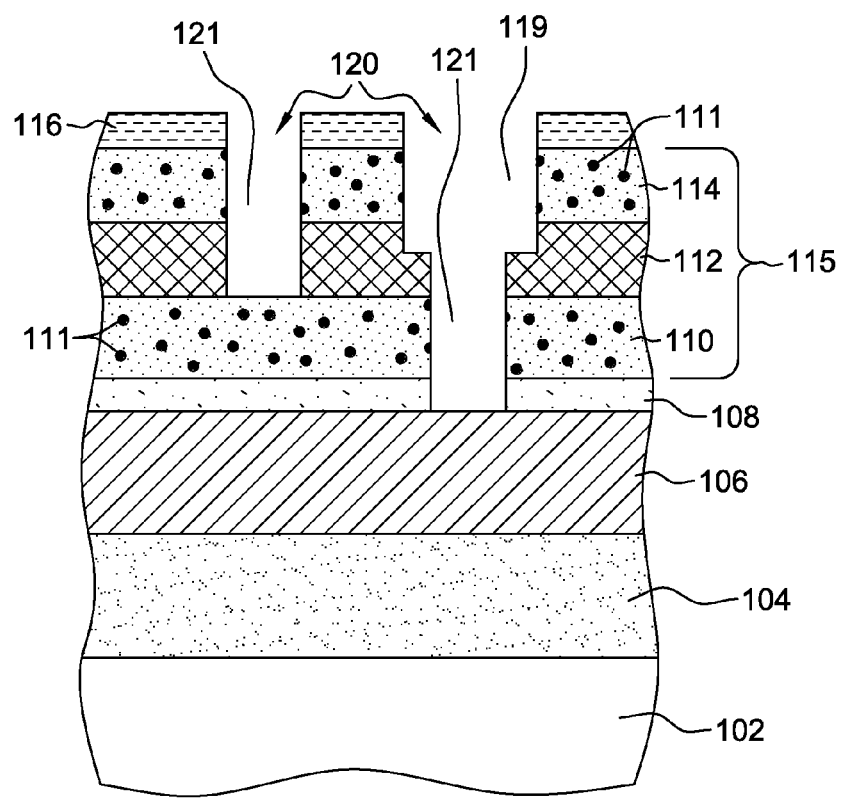
FIG. 1G depicts the structure of FIG. 1F after forming openings in the structure, in accordance with one or more aspects of the present invention.

FIG. 1G illustrates the structure of FIG. 1F after patterning and etching, which results in removal of protective layer 116 and a portion of interlayer structure 115 to form openings 120. By way of example, opening 120 may include one or more trenches 119 extending into interlayer structure 115, for instance, into insulating layer 114 and at least partially into insulating layer 112. Such trenches 119 may be capable of being filled with a conductive structure such as one or more metal lines, which support electrical connections along its horizontal length. Openings 120 may further comprise one or more vias 121 extending into interlayer structure 115, for instance, through interlayer structure 115 and etch stop layer 108, to metal layer 106. Vias 121 are to be filled with conductive structures to, for example, facilitate vertical connection between BEOL metal layers of an integrated circuit. Because insulating layer 110 and insulating layer 114, including porogens 111, are solid materials, etching through these layers will leave openings 120 with smooth, solid side walls without etch or ash damage, which may occur when porous materials are used. During the etching, some porogens 111 may be partially etched but will continue to remain structurally solid. In a subsequent step to fill openings 120 with conductive structures, the material(s) of the conductive structures will be confined by the solid walls of openings 120, in contrast to having porous side walls, which could allow migration of conductive material into the insulating layers. Insulating layer 112, which may be an evaporable material, is a solid material without air gaps which may be subsequently introduced in later processing steps, and therefore may be patterned and etched to form openings 120 with smooth, solid walls. Because of these smooth solid walls, for example, openings 120 may be filled with materials without leakage of such materials through the walls of openings 120 into interlayer structure 115.

Patterning of the structure of FIG. 1F may be accomplished using any suitable lithography process. Following patterning, material removal may be performed by, for example, any suitable etching process, such as an anisotropic dry etching process, for instance, reactive-ion-etching (RIE) in sulfur hexafluoride ($SF_6$). When an etchant that is selective to the material of etch-stop layer 108 is used, etching will naturally be stopped at etch-stop layer 108, protecting materials therebelow. Etch-stop layer 108 may then be selectively removed, for instance, using a different etch chemistry, for example dry etching.

Figure 1H:
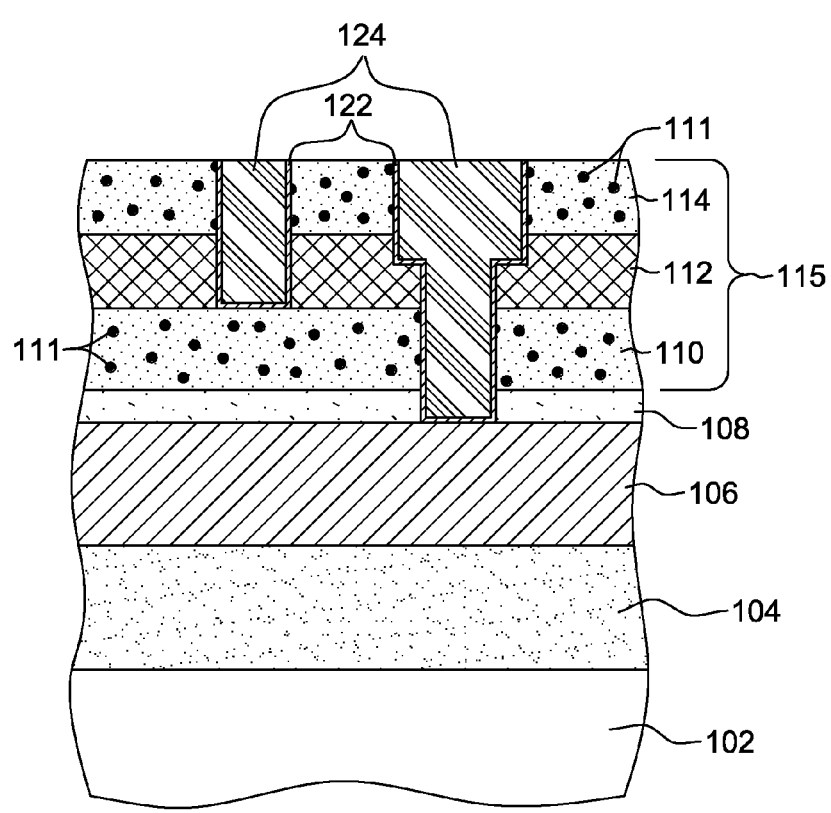
FIG. 1H depicts the structure of FIG. 1G after providing conductive material within the openings to form conductive structures, in accordance with one or more aspects of the present invention.

FIG. 1H illustrates the structure of FIG. 1G after a performing one or more metallization steps to provide conductive structures 124 within the openings, and subsequently removing protective layer 116 (see FIG. 1G). In one example, the conductive structures 124 may include liners 122 deposited into openings 120. A liner refers generally to any film or layer which may include part of the conductive structure, and include (for instance) one or more conformally-deposited layers, which may include titanium (Ti), carbon doped titanium, tungsten (W), a tungsten nitride (WN), titanium nitride (TiN), tungsten nitride (WN), tantalum nitride (TaN), titanium aluminum nitride (TiAlN), and the like. Liners 122 may be deposited using ALD, CVD, or any other suitable process, and facilitate the forming of conductive structures 124 by filling the openings (see FIG. 1G) with a material, such as a metal, such as copper, tungsten, or the like. Because uncured interlayer structure 115 is a substantially smooth, solid, non-porous structure, there is little risk that liner material 122 will migrate into the dielectric layer(s), which could otherwise reduce performance and increase leakage of the integrated circuits. Conductive structures 124 are formed within openings 120 (FIG. 1G), with one or more conductive structures 124 extending, for instance, through interlayer structure 115 and etch-stop layer 108 to metal layer 106. During metallization processing, interlayer structure 115 provides mechanical stability to support formed conductive structures 124, as all three insulating layers, in their uncured state, are solid materials, without air gaps or pores.

Figure 1I:
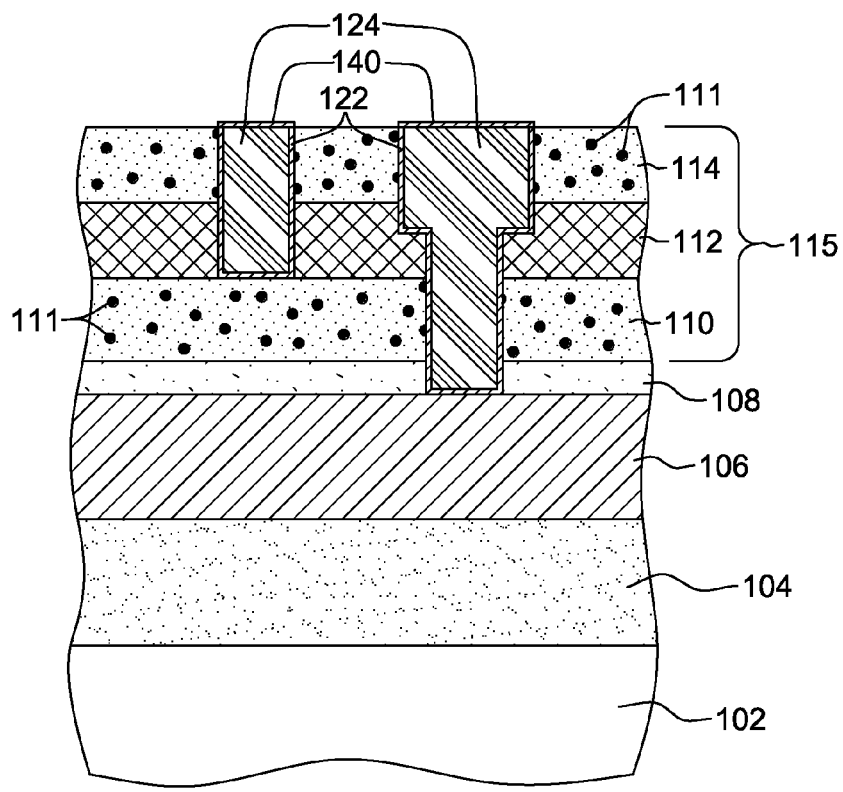
FIG. 1I depicts the structure of FIG. 1H after disposing a protective capping layer over the conductive structures, in accordance with one or more aspects of the present invention.

FIG. 1I illustrates the structure of FIG. 1H after providing (in one example) capping layers 140 over conductive structures 124. Capping layers 140 may, in one example, be deposited using ALD, CVD, or any other suitable process, and serve to protect conductive structures 124 from oxidation damage during subsequent high-temperature processing. Capping layers 140 may comprise, for example cobalt (Co) layers, and may be deposited in a selective Co capping process.

Figure 1J:
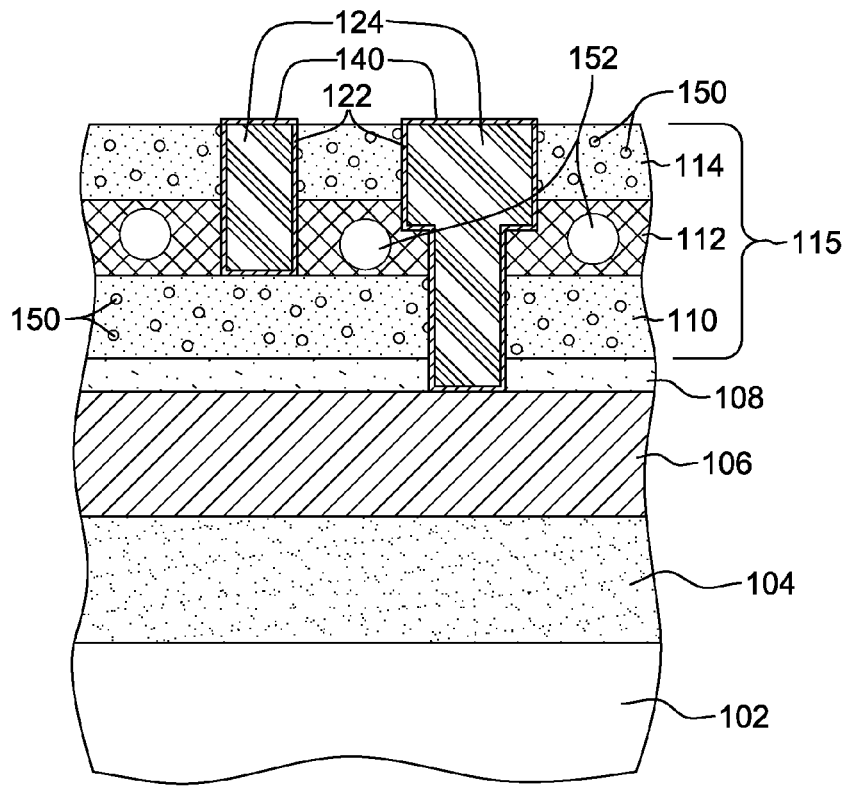
FIG. 1J depicts the structure of FIG. 1I after curing the structure leaving air gaps in the insulating layer having the evaporable material and pores in the insulating layers having the porogens, in accordance with one or more aspects of the present invention.

FIG. 1J illustrates the structure of FIG. 1I after curing interlayer structure 115. As depicted, the curing process may evaporate a portion of the evaporable material of insulating layer 112, leaving air gaps 152 therein, and may degrade a portion of porogens 111 (see FIG. 1I) of insulating layer 110 and insulating layer 114, leaving pores 150 therein. In the example shown, it is assumed that the air gaps 152 are larger than the pores 150. For instance, air gaps 152 may be between 10 and 30 nanometers in size, and pores 150 may be between 1 and 3 nanometers in size. Interlayer structure 115 may be cured using any suitable energy source, including thermal energy, electron-beam, UV, X-ray, infrared, visual light, etc. In one example, thermal energy could be applied to heat interlayer structure 115 to between 100° C. and 600° C., for instance, between one and twenty minutes. In another example, an electron-beam may be applied, with the electron energy ranging between 100 electron-volts (eV) and 500 keV. In yet another example, ultra-violet light could be applied at a temperature of approximately 350° C. for between one and ten minutes. In another example, depending upon the materials and thickness used, approximately two to three minutes of UV light could be sufficient to achieve the desired curing of interlayer structure 115.

During the curing process, at least a percentage of the evaporable material of insulating layer 112, and degradable porogens 111 of insulating layer 110 and insulating layer 114, may transition into a gaseous phase and migrate or bubble through the interlayer structure 115, thereby leaving the depicted structure. For example, gas formed from porogens 111 in insulating layer 110 may migrate through insulating layer 112 and insulating layer 114, to escape the structure. Resultant air gaps 152 and pores 150 may be filled either with air or another gas, or may have a partial vacuum therein, depending on the process conditions used. Because the dielectric constant of air or a vacuum is approximately one (1), the formation of air gaps 152 and pores 150 serves to reduce the effective dielectric constant of interlayer structure 115. In one example, the dielectric constant of interlayer structure 115 may be between 2.55 and 3; while in another example, the dielectric constant of interlayer structure 115 may be between 1.8 and 2.0. Therefore, interlayer structure 115, which had an initial capacitance before the curing process, will have a final capacitance after curing that is lower than the initial capacitance, and in one example may be 50% of the initial capacitance. As is known in the art, the capacitance of, for example, a parallel plate capacitor is proportional to the dielectric constant. With the plates of the parallel capacitor being, in this case, adjacent metal layers or levels of the integrated circuit.

After the curing process, interlayer structures 115 still facilitate maintaining structural stability of conductive structures 124, because insulating layer 110 and insulating layer 114, while porous, retain sufficient structural capacity to support the conductive structures at their interface, despite the fact that air gaps 152 may have weakened the structural capacity of insulating layer 112. In one example, a single cured, porous, insulating layer 114 may be sufficient to provide structural stability to conductive structures 124, while in another example, porous, insulating layer 110 is further required for structural stability. In addition, capping layers 140 protect conductive structures 124 from oxidation during the curing process, thereby preserving their electrical contact capabilities.

Figure 1K:
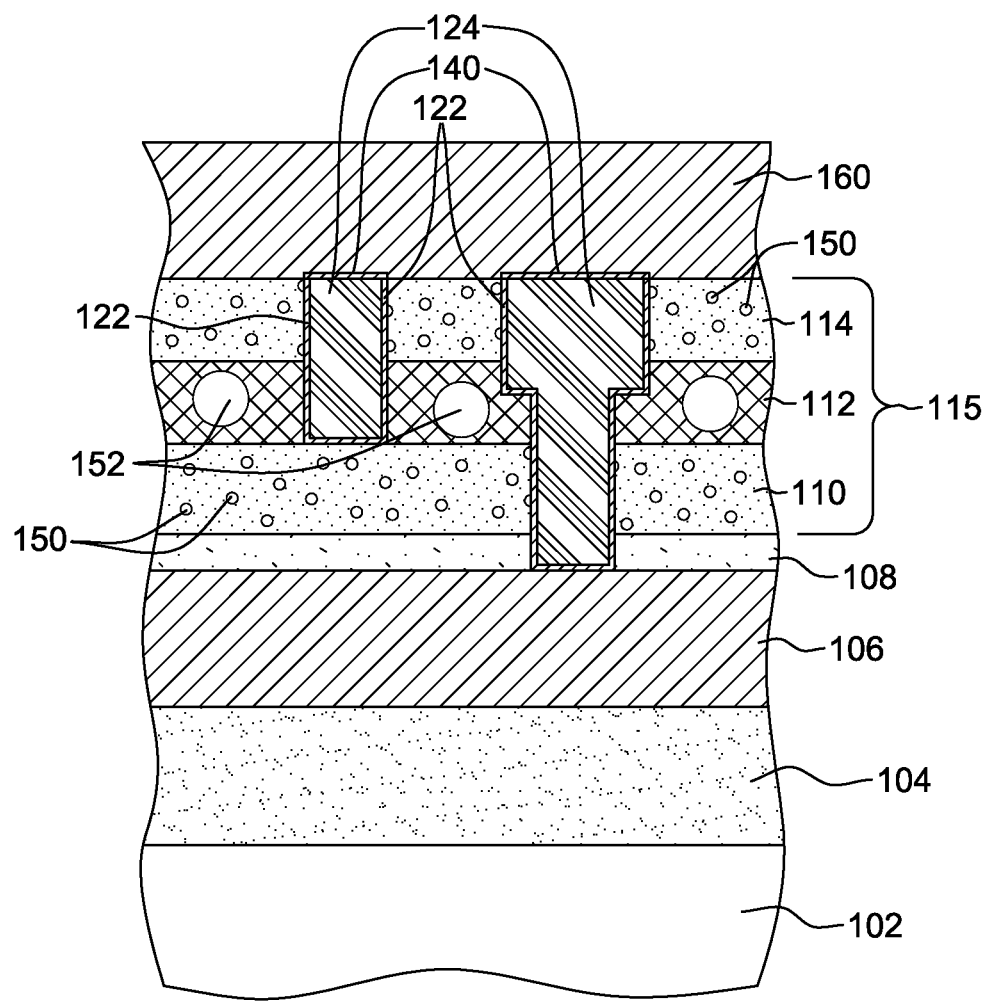
FIG. 1K depicts the structure of FIG. 1J after another metal layer has been disposed over the structure, in accordance with one or more aspects of the present invention.

FIG. 1K illustrates the intermediate structure of FIG. 1J after another metal layer 160 has been disposed over interlayer structure 115 and conductive structures 124. As depicted, one or more conductive structures 124 facilitate electrical connection between metal layer 160 and metal layer 106, and in so doing, facilitates electrical connection between metal layer 160 and device layer 104. In an integrated circuit fabrication process, there could be, for instance, between six to ten metal layers, with additional interlayer structures formed between each adjacent metal layer. After forming metal layer 160, for example, another interlayer structure could be formed above metal layer 160, using the processing steps previously described herein to achieve a reduced capacitance for those layers, used as described.

Figure 2:
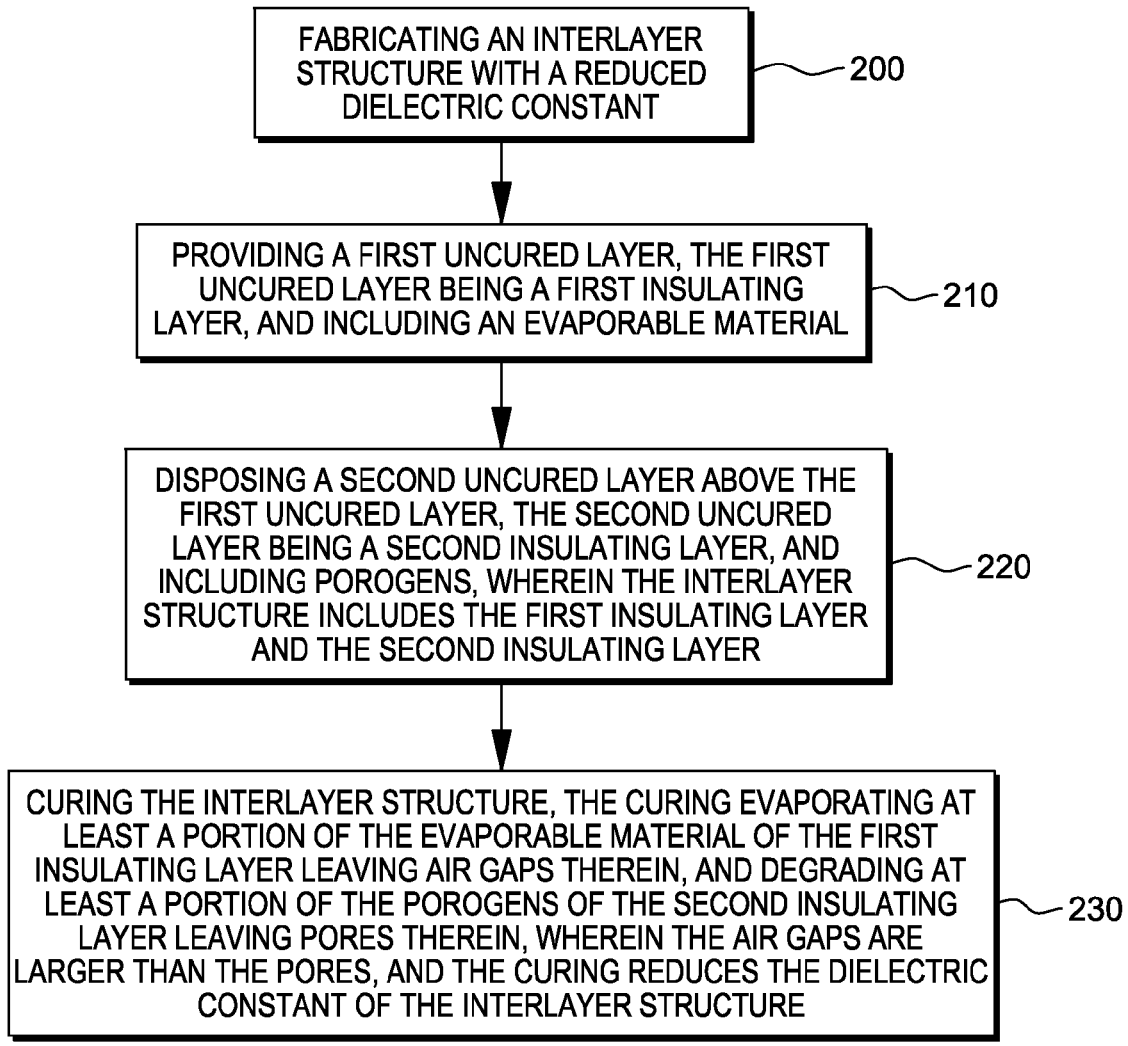
FIG. 2 depicts one embodiment of a process for facilitating fabricating an interlayer structure with a reduced dielectric constant, in accordance with one or more aspects of the present invention.

By way of summary, FIG. 2 illustrates an overview of one embodiment of a process for fabricating an interlayer structure with a reduced dielectric constant 200, in accordance with one or more aspects of the present invention. In the embodiment illustrated, the process includes, for example: providing a first uncured layer, the first uncured layer being a first insulating layer, and including an evaporable material 210; disposing a second uncured layer above the first uncured layer, the second uncured layer being a second insulating layer, and including porogens, wherein the interlayer structure includes the first insulating layer and the second insulating layer 220; and curing the interlayer structure, the curing evaporating at least a portion of the evaporable material of the first insulating layer leaving air gaps therein, and degrading at least a portion of the porogens of the second insulating layer leaving pores therein, wherein the air gaps are larger than the pores, and the curing reduces the dielectric constant of the interlayer structure 230.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating an interlayer structure with a reduced dielectric constant, the fabricating comprising:
providing a first uncured layer, the first uncured layer being a first insulating layer, and comprising porogens;
providing a second uncured layer above the first uncured layer, the second uncured layer being a second insulating layer, and comprising an evaporable material;
disposing a third uncured layer above the second uncured layer, the third uncured layer being a third insulating layer, and comprising porogens, wherein the interlayer structure comprises the first insulating layer, the second insulating layer, and the third insulating layer; and
curing the interlayer structure, the curing evaporating at least a portion of the evaporable material of the second insulating layer leaving air gaps therein, and degrading at least a portion of the porogens of the first insulating layer leaving pores therein and at least a portion of the porogens of the third insulating layer leaving pores therein, wherein the air gaps are larger than the pores, and the curing reduces the dielectric constant of the interlayer structure.

2. The method of claim 1, further comprising, prior to curing the interlayer structure:
forming at least one opening in the interlayer structure, the at least one opening extending through the third uncured layer and at least partially into the second uncured layer; and
providing a conductive material within the at least one opening to form a conductive structure, wherein providing the conductive material prior to curing the interlayer structure, and leaving the air gaps and the pores therein, inhibits migration of the conductive material into the second insulating layer or the third insulating layer.

3. The method of claim 2, wherein, after curing the interlayer structure, the third insulating layer comprising the pores facilitates maintaining structural stability of the conductive structure within the interlayer structure, notwithstanding the presence of the larger air gaps within the second insulating layer.

4. The method of claim 2, wherein the fabricating further comprises, prior to the curing, providing a substrate structure below the interlayer structure, wherein the substrate structure comprises a metal layer disposed above a substrate of the substrate structure, and wherein the conductive structure extends to the metal layer.

5. The method of claim 4, further comprising, after curing the interlayer structure, disposing another metal layer over the interlayer structure, wherein the conductive structure facilitates electrical connection between the metal layer and the another metal layer.

6. The method of claim 5, wherein the substrate structure further comprises a device layer, wherein the device layer is disposed below the metal layer, and wherein the conductive structure facilitates electrical connection between the device layer and the another metal layer.

7. The method of claim 1, further comprising, prior to curing the interlayer structure:
   forming at least one opening in the interlayer structure, the at least one opening extending through the third uncured layer, and the second uncured layer, and at least partially into the first uncured layer; and
   providing a conductive material within the at least one opening to form a conductive structure, wherein providing the conductive material prior to curing the interlayer structure, and leaving the air gaps and the pores therein, inhibits migration of the conductive material into the first insulating layer, the second insulating layer, or the third insulating layer.

8. The method of claim 7, wherein, after curing the interlayer structure, the third insulating layer comprising the pores and the first insulating layer comprising the pores facilitate maintaining structural stability of the conductive structure within the interlayer structure, notwithstanding the presences of the larger air gaps within the second insulating layer.

9. The method of claim 1, wherein, after curing the interlayer structure, the interlayer structure has an effective dielectric constant between 1.8 and 2.0.

10. The method of claim 1, wherein the first uncured layer comprises a first $C_xH_y$ material, and the second uncured layer comprises a second $C_xH_y$ material.

11. The method of claim 1, wherein the porogens comprise one of a terpinene or a cyclodextrin, and the evaporable material comprises a $C_xH_y$ material.

12. The method of claim 1, wherein the first insulating layer has a thickness of between 30 and 60 nanometers, and the second insulating layer has a thickness of between 30 and 60 nanometers.

* * * * *